(12) United States Patent
Liepe

(10) Patent No.: US 6,788,754 B1
(45) Date of Patent: Sep. 7, 2004

(54) METHOD AND APPARATUS FOR DE-SKEWING CLOCK EDGES FOR SYSTEMS WITH DISTRIBUTED CLOCKS

(75) Inventor: Steven F Liepe, Ft Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 802 days.

(21) Appl. No.: 09/686,111

(22) Filed: Oct. 10, 2000

(51) Int. Cl.[7] ............................................. H03D 3/24
(52) U.S. Cl. ...................... 375/375; 375/373; 327/158; 713/401; 713/503
(58) Field of Search ............................. 375/375, 372, 375/354, 371, 373; 327/153, 161, 158, 149, 244, 231; 713/401, 503; 710/61

(56) References Cited

U.S. PATENT DOCUMENTS

| | | | |
|---|---|---|---|
| 5,734,685 A | | 3/1998 | Bedell et al. |
| 5,815,017 A | * | 9/1998 | McFarland ................. 327/158 |
| 6,052,011 A | * | 4/2000 | Dasgupta ................... 327/270 |
| 6,121,808 A | * | 9/2000 | Gaudet ...................... 327/231 |
| 6,236,695 B1 | * | 5/2001 | Taylor ....................... 375/372 |

OTHER PUBLICATIONS

"Active GHz Clock Network Using Distributed PLLs", Digest of Technical Papers—2000 IEEE Int'l Solid–State Circuits Conference (Feb. 8, 2000), pp. 174–177 and 454–455.

* cited by examiner

Primary Examiner—Phuong Phu

(57) ABSTRACT

The present invention relates to a system and method for adaptively adjusting delays along selected signal paths in order to equalize the signal delays at various distributed points within an integrated circuit. Where a signal traverses an initial outgoing path and a return path, delay elements disposed in each of the paths may be adjusted in order to set the entirety of the delay of the signal having traveled the entire signal trajectory equal to the delay present in a deliberately introduced delay element of known value. Alternatively, the inventive mechanism may control a selected one of two (or other plurality of) delay elements so as to automatically and adaptively adjust the delay value of the selected delay element so as to equalize the signal delay incurred along two or more signal paths.

20 Claims, 4 Drawing Sheets

METHOD AND APPARATUS FOR DE-SKEWING CLOCK EDGES FOR SYSTEMS WITH DISTRIBUTED CLOCKS

BACKGROUND

When operating microprocessors and other digital equipment embodied within integrated circuits (ICs), it is generally desirable to coordinate and/or synchronize the transmission of signals from clocks distributed throughout such chips. Such synchronization would generally aid in enabling related operations to cooperate in a timely and orderly manner. Undesired and unpredictable variation in the propagation times of signals along different paths could lead to race conditions and other malfunctions in the operation of the microprocessor or other integrated chip device.

As chips become larger, more complex, and more powerful, the number of factors potentially causing variation in signal transmission speed along different paths within an IC generally increases. These factors include, voltage levels, current flow levels, operating frequency, and temperature. Other factors contributing to variation in signal transmission speed include variation in the geometric length of the signal paths and inconsistency of electrical properties such as resistance and capacitance which may be encountered by different signals propagating through different parts of an integrated chip. Even though attempts have been made to balance the signal transmission delays on various clock routes in order to equalize propagation times along these routes, the unpredictability of many of the above-mentioned factors makes it extremely difficult to fully maintain signal transmission delay consistency across different signal paths.

Another approach to equalizing transmission path delays involves inserting delay circuits such as phase lock loops (PLLs) or delay lock loops (DLLs) within selected transmission paths to compensate for variation arising from known factors causing transmission path delay divergence within a chip. Where causes of transmission time or transmission delay divergence between different paths in a circuit are known and fixed, such circuits may present a viable solution. However, where variations in transmission time are variable and unknown, an initial setting of the delay circuits will likely fail to assure consistency in signal propagation time along various transmission paths. Factors which are likely difficult to ascertain in advance include process variation from one chip to another, as well quantities such as voltage, current, and temperature, which may vary from chip to chip, as well as within a single chip. It would therefore be very difficult to preset the values of delay circuits to achieve transmission time consistency among a plurality of signal transmission paths.

Accordingly, it is a problem in the art that variation in voltage and current levels, temperature, and electrical properties of various transmission paths generally cause alternate signal transmission paths in an IC to experience divergent transmission delays or latency periods.

It is a further problem in the art that such divergent latency periods may lead to race conditions and potentially cause malfunctions within an IC.

It is a still further problem in the art that strategically arranging the geometry of signal transmission paths generally does not cure the problem of inconsistent signal transmission path latency.

It is a still further problem in the art that introducing circuit elements for delaying signal transmission to compensate for variability in signal path transmission latency is generally unable to compensate for signal path latency differences arising from chip manufacturing process variation, and from variation in voltage, current, and temperature.

SUMMARY OF THE INVENTION

The present invention is directed to a system and method for providing self-governing real-time feedback signal path latency equalization to synchronize the transmission of signals propagating along separate paths in an integrated circuit. The inventive mechanism preferably provides for automatic self-regulating phase or delay equalization in a manner which is independent of the cause or amount of propagation time delay variation between alternative signal transmission paths.

In a preferred embodiment, feedback loops are employed which receive signal delay values as inputs and generate a corrective output signal substantially proportional to a disparity in the input delay values, thereby enabling a magnitude of a corrective output signal to a level suited to a current level of signal transmission time disparity. In this manner, a delay circuit designed to compensate for a transmission signal time difference between two circuits may be continuously adjusted in real time to compensate for real time variations in the factors leading to this transmission signal time variation. Since the inventive circuit employs the actual signal delay variation as an input variable for a determination of a delay value, all causes of this signal delay variation are preferably compensated for regardless of the sources of the delay. Accordingly, there is preferably no need to conduct complex calculations to anticipate desired signal delay values within particular signal transmission paths.

In a preferred embodiment, the self-governing delay equalization circuits of the present invention may be scattered throughout a chip so as to equalize delays in distributed locations and thereby avoid imposing an excessive delay equalization burden in a single centralized location. Moreover, the careful deployment of phase detectors and other selected circuit elements may be beneficially employed to reduce electrical noise along the various signal paths while also equalizing delays along these signal paths. Moreover, the implementation of self-governing delay equalization may be applied to subsets of an initial set of circuits, thereby enabling the creation of a hierarchy of delay-equalized sub-circuits having equal signal transmission delay times. In this manner, the signal delay present at a multitude of points throughout an IC, with respect to one or more time reference points or clock reference points may be determinable with substantial accuracy.

It will be appreciated that while much of the above discussion herein is directed to integrated circuits and digital equipment, the present invention may be applicable to any circuit having undesired transmission time variations between alternative signal paths including analog circuits, hybrid circuits, and circuits which are not solid state, and all such variations are included within the scope of the present invention.

Accordingly, it is an advantage of a preferred embodiment of the present invention that signal path transmission delays arising from substantially unpredictable sources such as temperature, voltage, and current fluctuations may be adaptively compensated for in real time without knowing the sources or relative magnitude of contribution to a resulting delay of each of the afore-mentioned sources.

It is a further advantage of a preferred embodiment of the present invention that race conditions and other operational problems arising from signal path transmission time or transmission delay variations may preferably be avoided.

It is a still further advantage of a preferred embodiment of the present invention that the inventive self-governing signal path delay equalization circuit may be employed to reduce electrical noise levels along the various signal transmission paths. The ability to control when clock edges occur generally allows a system designer to deliberately skew circuit clock edges to prevent circuits employing those clock edges from switching simultaneously, thereby reducing instantaneous power and electrical noise.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1A:
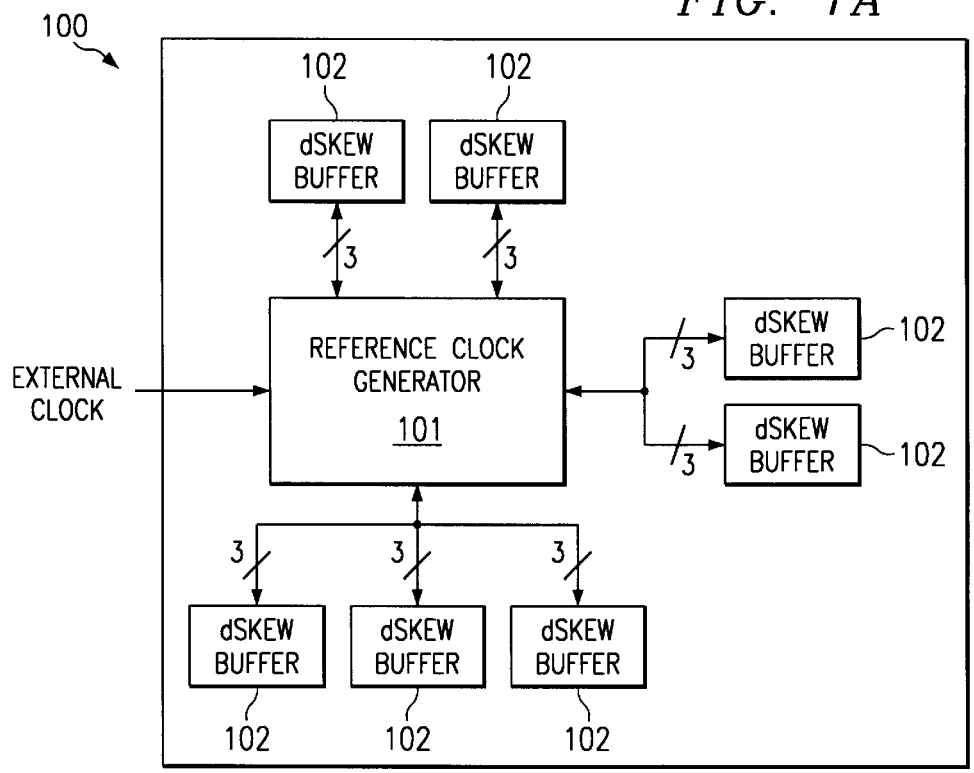
FIG. 1A depicts an outline of a integrated circuit upon which path delay equalization may be practiced according to a preferred embodiment of the present invention.

FIG. 1A depicts an outline 100 of a integrated circuit according to a preferred embodiment of the present invention. FIG. 1A depicts reference clock generator 101 and a plurality of buffers 102 shown located at varying distances from clock generator 101. The "/3" symbol refers to the three lines generally employed to transmit signals from clock generator 101 to the various buffers 102, these three lines generally including 1) reference clock send signal, 2) the delay buffer interconnect return signal, and 3) the phase detector output signal. The dskew buffers 102 generally correspond to elements 129, 132, 130, and 135 within FIG. 1B. A dskew buffer 102 generally drives the clock net the area of chip containing the four identified elements of FIG. 1B and contains the delay compensation elements. Element 135 is preferably a buffer associated with variable delay element 130.

Herein, the following terms generally refer to the phase of one or more signals within the various depicted circuits: signal transmission latency, phase, delay, signal transmission delay, signal phase, and phase delay. Herein, the term "clock net" generally refers to clock routes distributed within the depicted circuitry. The term "routes" generally refers to traces that are disposed as needed to established proper connections. A collection of such routes preferably forms a network or net of clock traces within a circuit block.

Figure 1B:
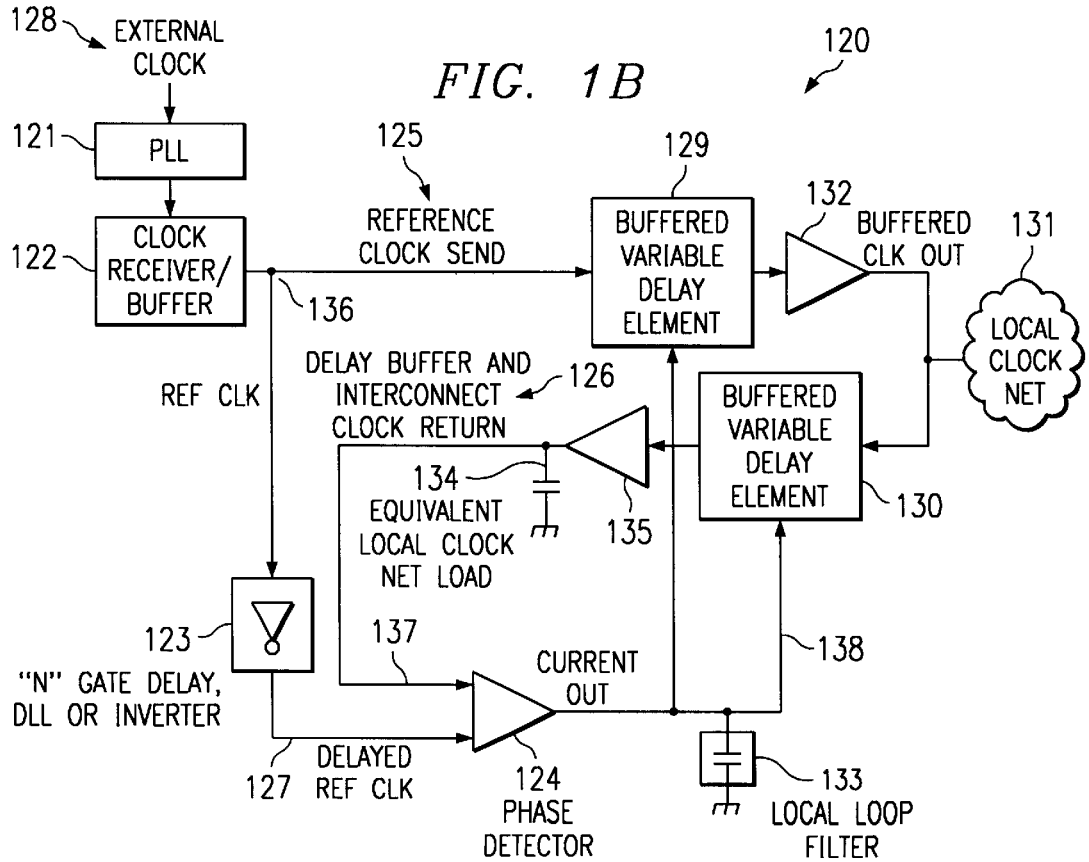
FIG. 1B is a block diagram of a delay matching circuit according to a preferred embodiment of the present invention.
Figure 1C:
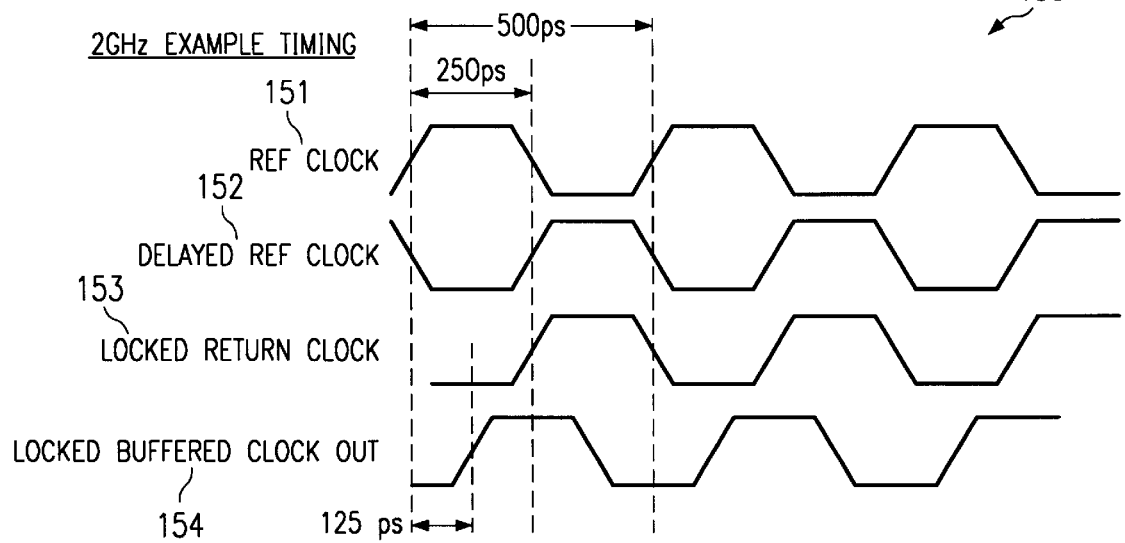
FIG. 1C is a timing chart associated with components depicted in FIGS. 1A and 1B according to a preferred embodiment of the present invention.

Generally, reference clock generator 101 and dskew buffers 102 may be placed anywhere within an IC. Generally, the various routes from clock generator 101 to dskew generators 102 need not be delay matched. The double-arrowed lines in FIG. 1A generally represent the following signals: clock send, return and delay feedback control lines. Reference may be made to FIGS. 1A, 1B, and 1C in the following.

A number of timing sequences or timing diagrams are depicted in FIG. 1C. Reference clock signal 151 is depicted at the top of a set of four clock signals in FIG. 1C. It may be seen that the period of reference clock signal 151 has been set to 500 picoseconds (ps). Shown immediately below reference clock signal 151 is delayed reference clock pulse 152 which is delayed by 250 ps with respect to reference clock signal 151. Such an inversion may be accomplished by running reference clock signal 151 through inverter 123, as shown in FIG. 1B. Shown third from the top, among the timing diagrams, is locked return clock 153 which generally corresponds to delay buffer and interconnect clock return 126 in FIG. 1B.

In a preferred embodiment, an objective of the circuit depicted in FIG. 1B is to match the delay point of delayed reference clock point 127 with delay buffer and interconnect clock return (clock return) point 126. Otherwise stated, it is desired to equalize an extent and/or rate of signal propagation along the paths leading to points 126 and 127, such that points 126 and 127 are at the same point in the cycle of a particular clock pulse signal.

In a preferred embodiment, the elements depicted on the left side of FIG. 1B generally correspond to reference clock generator 101 in FIG. 1A, and the components on the right side of FIG. 1B generally correspond to any one of the dskew buffers 102 depicted in FIG. 1A.

With reference to FIG. 1B, in a preferred embodiment, a signal input to circuit 120 is preferably provided by external clock 128 and directed through phase locked loop (PLL) 121 to clock receiver/buffer 122. A rising edge of the clock pulse then preferably emerges from clock receiver/buffer 122. This output from receiver/buffer 122 generally proceeds along a $1^{st}$ path, the "reference clock send" 125 toward a first buffered variable delay element 129, and along a second path toward inverter 123.

Proceeding along the "reference clock send" path 125, the clock signal preferably proceeds toward first buffered variable delay element 129. The clock signal then preferably proceeds toward local clock net 131 which is the intended recipient of clock signals or clock pulses. The signal delay for the clock pulse in traveling from delay element 129 to clock net 131 is generally relatively small in comparison to the delay incurred in traveling from clock receive/buffer 122 to buffered variable delay element 129.

Preferably, the circuit of FIG. 1B operates to match the phase delay or signal transmission latency of the reference clock send 125 with clock return 126. When these signal transmission delays are matched, the various operations within an integrated circuit generally operate as desired. Where the signal transmission delays are not matched, there will generally be variation in signal phase or clock pulse phase between the buffers and clock nets throughout the integrated circuit, thereby potentially leading to inaccurate operation of the integrated circuit.

An example is considered involving various propagation delays and variable signal delay values. In this example, the delay incurred in propagating the signal from clock receiver/buffer 122 to delay element 129 is 50 ps, and the initial value of time delay in delay element 129 is also 50 ps. It is presumed for the sake of this example that the additional time to transmit the clock signal to clock net 131 is negligible. Accordingly, 100 ps will generally have elapsed in transmitting the clock pulse from clock receiver/buffer 122 to clock net 129.

Continuing with the example, after reaching local clock net 131, the signal preferably returns through second buffered variable element 130, which is initially set to delay the signal by 50 ps. The signal then takes about 50 ps to return to the region of the reference clock 136 on the left side of FIG. 1B. Accordingly, upon reaching a point indicated by reference numeral 137, a total of 200 ps will generally have elapsed since the signal emerged from clock receiver/buffer 136.

Equivalent clock net load 134, which preferably includes a capacitor, may be connected to the output of delay element 130 in order to match the capacitance of local clock net 131. Connecting equivalent clock net load 134 in this manner preferably operates to make the clock signal send and return paths as similar as possible in terms of loads, buffers, and delays.

Continuing with the example, it may be seen that there are two inputs to phase detector 124. A first input 137 was previously shown to have experienced about 200 ps of delay with respect to the output 136 from clock receive/buffer 122. For the second input to detector 124, "delayed reference clock" 127, the signal at reference clock node 136 is directed through inverter 123, thereby generating a signal having an effective delay of 250 ps with respect to the reference clock point 136. This effective delay may be seen by comparing delayed reference clock pulse timing diagram 152 with reference clock pulse timing diagram 151 in FIG. 1C.

Continuing with the example, inputs 137 and 127 to phase detector 124 will generally present an initial phase disparity of 50 ps. It is generally desirable to cause the circuit of FIG. 1B to at least substantially eliminate this disparity, thereby equalizing the delay along the reference clock send 125 and clock return 126 paths. Preferably, phase detector 124 operates to produce a current 138 proportional to the phase difference between inputs 127 and 137. The phase detector 124 output current 138 preferably charges local loop filter 133, which preferably includes a capacitor, thereby raising the voltage output of the capacitor and driving this voltage into buffered variable delay elements 129 and 130.

In a preferred embodiment, the voltage output from local loop filter 133 causes the delay in both the first and second variable delay elements, 129 and 130, respectively, to rise by 25 ps, thereby raising the time delay in signal travel from the reference clock 136 to the local clock net 131 and the return path from local clock net 131 to upper input to phase detector 137 to each rise from 100 ps to 125 ps. Accordingly, the round trip from reference clock signal 136 to the upper input 137 to the phase detector should now take 250 ps, instead of the previous value of 200 ps, which matches the delay introduced by inverter 123, thereby equalizing the delay or phase difference introduced by the two paths.

In this manner, the present invention preferably enables the phase difference present at the inputs 127 and 137 at phase detector 124, through the mechanism of the local loop filter 133 voltage and the voltage controlled delay mechanism of delay elements 129 and 130 to adaptively equalize the phases of the two inputs, thereby providing an automatic and self-regulating mechanism for phase delay equalization between separate signal transmission paths within the circuit of FIG. 1B. It will be appreciated that the phase or delay equalization mechanism of the present invention is not limited to the specific circuit layout depicted in FIG. 1B but may be applied to wide range of circuit topologies, and all such variations are included within the scope of the present invention.

In the circuit of FIG. 1B, a sequence of conversions of phase difference to current, current to voltage, and ultimately, voltage to time delay was employed to provide automatic phase equalization. However, it will be appreciated that numerous substitutions of electrical devices and sequences of operations may be implemented to achieve the desired phase equalization. For example, a voltage input for driving delay values within delay elements 129 and 130 may be obtained by driving the phase detector output current 138 through a resistor and using the resistor's voltage drop to drive the delay values within delay elements 129 and 130. Moreover, active devices may be employed as substitutes for passive electrical components such as resistors and capacitors to calculate an appropriate delay control output for delay elements 129 and 130 based upon current 138, and all such variations are included within the scope of the present invention.

Figure 2:
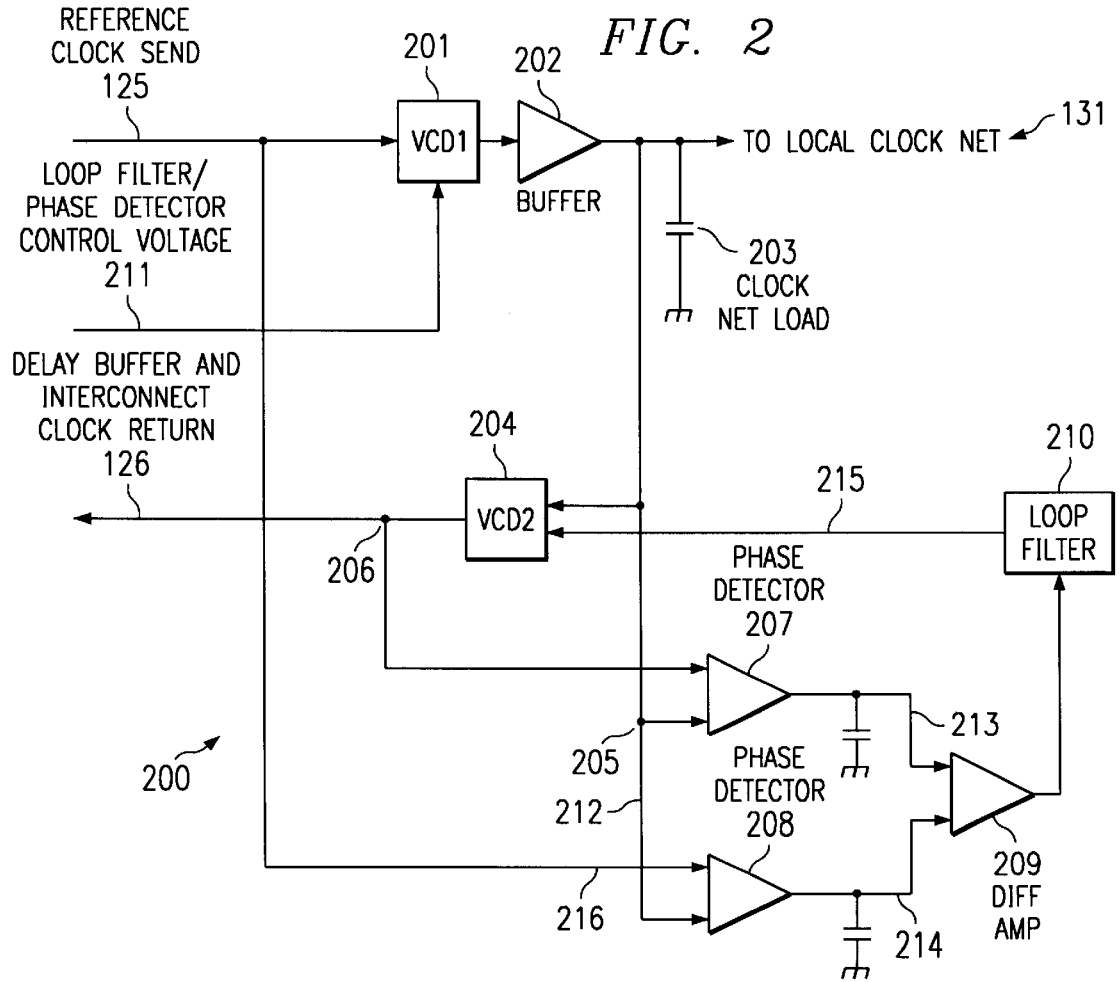
FIG. 2 depicts an alternate delay matching scheme according to a preferred embodiment of the present invention.

FIG. 2 depicts an alternate delay matching scheme 200 according to a preferred embodiment of the present invention. The embodiment depicted in FIG. 2 preferably obviates a need for an equivalent local clock net load as represented by reference numeral 134 in FIG. 1. Generally, when the actual clock net load changes, a mismatch may arise between the actual clock net load and the equivalent clock net load. It is generally desirable to automatically compensate for variation in the clock net load and other variable conditions within an integrated circuit. Such automatic compensation is preferably provided in the embodiment of FIG. 2.

In a preferred embodiment, reference clock send signal 125 proceeds along a signal path toward voltage controlled delay element 1 (VCD) 201 whose delay value is preferably controlled by loop filter/phase detector control voltage (control voltage 1) 211. Thereafter, the clock signal proceeds out of VCD1 201 through buffer 202 to local clock net 131. Clock net load 203 is generally represents the capacitive load of local clock net 131.

In a preferred embodiment, the signal at the output of buffer 202 is directed into VCD2 204 and proceeds to delay buffer and interconnect clock return (clock return) 126 on the left side of FIG. 2. The delay within VCD2 204 is preferably adaptively determined in order match the delays along the reference clock send 125 and clock return 126 paths employing circuitry including phase detectors 207 and 208, differential amplifier 209 and loop filter 210.

This approach differs from that presented in FIG. 1B wherein the control voltage supplied to delay elements 129 and 130 was generally the same. It will be appreciated that circuit elements other than those depicted in FIG. 2 could be deployed to implement the adaptive delay value adjustment within a second delay element, in this case voltage controlled delay element 204, including active digital components, and all such variations are included within the scope of the present invention.

In a preferred embodiment, the total transmission signal delay incurred between reference clock send 125 and the output of buffer 202, which is directed to local clock net 131, including the contribution of VCD1 201, is input to phase detector 208, and the total transmission signal delay incurred between buffer 202 output and clock return 126, including the contribution of VCD2 204, is input to phase detector 207.

It may be seen that the upper input 216 to phase detector 208 is on the same "time" node as reference clock send 125, and that the lower input 212 to phase detector 208 is on the same "time" node as buffer 202 output and the point of signal transmission to local clock net 131. Accordingly, phase detector 208 will preferably measure the phase difference incurred between reference clock send 125 and the output of buffer 202 on the send signal path. The return path phase delay is analogously represented by the inputs to phase detector 207.

It may be seen that the lower input 205 to phase detector 207 is on the same node as buffer 202 output and the point of signal transmission to local clock net 131, as well as on the same node as phase detector 208 lower input 212. It may also be seen that the upper input 206 to phase detector 207 is on the same node as clock return 126. Accordingly, phase detector 207 will preferably measure the phase difference incurred between buffer 202 output and clock return 126, including the contribution of VCD2 204. Generally, the phase difference detected by phase detector 207 will produce voltage input 213 to differential amplifier 209, and the phase difference detected by phase detector 208 will produce voltage input 214 to differential amplifier 209.

Where the phase differences input to phase detectors 207 and 208 are the same, no corrective modification of the delay value of VCD2 204 will generally be effected, as the voltage input values 213 and 214 to differential amplifier 209 will be the same. However, where the phase differences, as represented by the outputs of phase detectors 207 and 208, differ, the resulting voltage difference between differential amplifier inputs 213 and 214 will preferably drive differential amplifier 209 to output a corrective signal to loop filter 210 and ultimately to VCD2 204. The filtered corrective input 215 to VCD2 204 preferably operates to adjust VCD2 204 such that the phase differences present at phase detectors 207 and 208 become equal. Generally, the greater the disparity between the phase differences at detectors 207 and 208, the greater the value of filtered corrective input 215 will be. Similarly, as the disparity between the phase differences at detectors 207 and 208 diminishes, filtered corrective input 215 will correspondingly decline in magnitude. Where the disparity in phase differences at detectors 207 and 208 disappears, the filtered corrective input to VCD2 204 is preferably also brought to zero. Preferably, the ability to set the delays in VCD1 and VCD2 independently, enables the inventive circuit to compensate for unknown and unpredictable variations occurring within the clock send and clock return circuit segments and preferably diminishes a need to exactly match various phase-relevant components disposed within these circuit segments.

Figure 3:
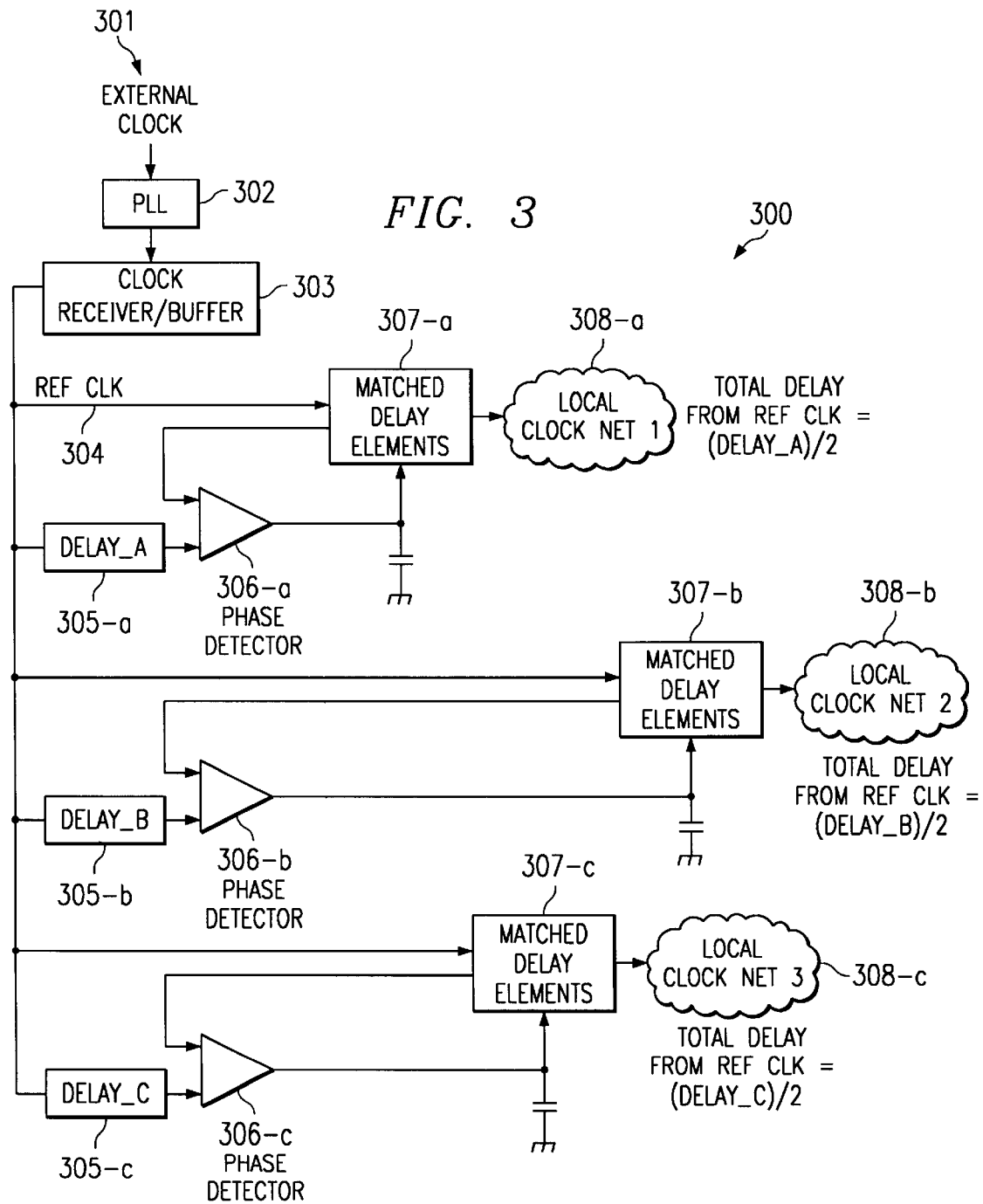
FIG. 3 depicts a circuit which presents a plurality of implementations of the delay matching circuitry of depicted in FIG. 2 according to a preferred embodiment of the present invention.

FIG. 3 depicts a circuit 300 which presents a plurality of implementations of the delay matching circuitry of depicted in FIG. 2 according to a preferred embodiment of the present invention. Generally external clock 301 drives PLL 302, which in turn drives clock receiver/buffer 303.

In a preferred embodiment, the inventive delay matching mechanism described in connection with FIG. 2 may implemented in a distributed manner for various circuits within an integrated chip or integrated circuit. Three substantially equivalent circuits, circuits a, b, and c, each employing a matched delay element, are shown in FIG. 3. Each of the matched delay elements generally corresponds to the combination of VCD elements, phase detectors, differential amplifier and loop filter depicted in the delay matching circuitry of FIG. 2. Once this delay matching circuitry is properly configured, it may generally be strategically deployed to provide controlled delays throughout an integrated chip or integrated circuit.

In a preferred embodiment, when using known delays, such as delay_a 305a, in combination with matched delay elements 307-a near local clock net 1 308-a, a consistent relationship emerges between the delay at local clock net 1 308-a and the known delay value of "delay_a." Specifically, the total delay from reference clock 304 to local clock net 1 308-a will generally be (delay_a)/2. This outcome is consistent with the example discussed in connection with FIG. 1.

Providing a known relationship between the delay at a local clock net and the value of a the delay at a deliberately introduced delay circuit element, such as delay element "delay_a," and known relationships between the delays present at various local clock nets, generally provides circuit designers with the benefit of having a high level of control over the signal delays occurring at distributed points throughout an integrated circuit and thereby avoids delay mismatches which may cause circuits to malfunction.

While a simple division by 2 represents the relationship between local clock net delay with respect to a reference clock in the depiction of FIG. 2, it will be appreciated that where more than 2 elements are being matched in the "matched delay elements" sub-circuit, such as sub-circuit 307-a, and/or where more complex self-regulating delay circuit topologies are constructed, more complex, although still known and controllable, mathematical relationships may exist between the clock signal delay present at a local clock net or other circuit node and the delay value of a deliberately introduced delay element such as delay_a 305a.

Figure 4:
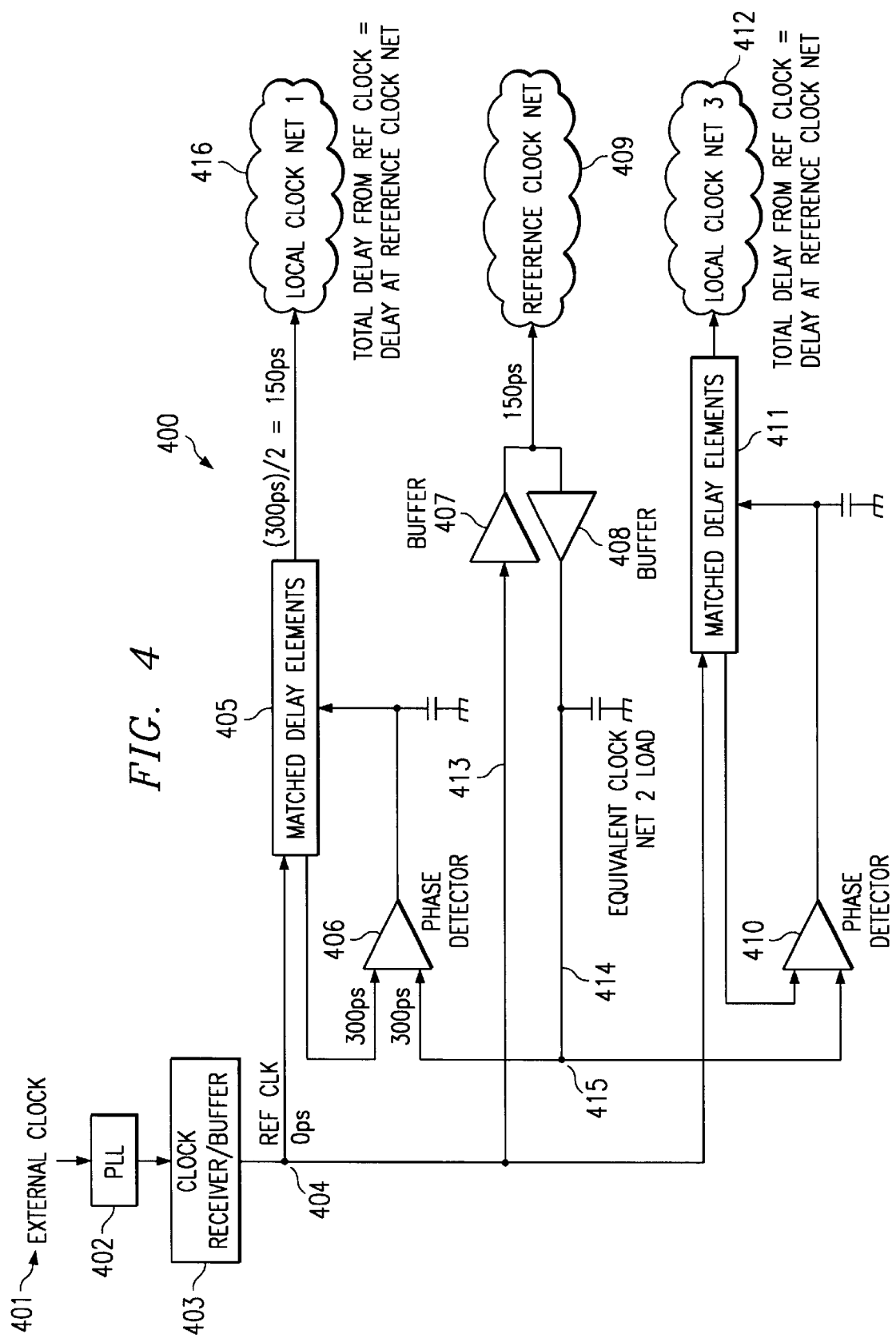
FIG. 4 depicts a simplified circuit employing inventive delay matching circuitry according to a preferred embodiment of the present invention.

FIG. 4 depicts a simplified circuit 400 employing the inventive delay matching circuitry according to a preferred embodiment of the present invention. In FIG. 4, the delay at a selected clock net, called reference clock net 409, is preferably employed as a known delay element for the signal paths for clock net 1 405 and clock net 3 412, thereby obviating a need for the insertion of the actual hardware for delay elements for those circuits.

An example is presented including the use of specific exemplary delay values. In this example, reference clock 404 is at 0 ps. In traveling along path 413 toward the right, a delay of 100 ps is incurred before reaching buffer 407 which generally introduces a further delay of 50 ps. Accordingly, the delay at reference clock net 409 is 150 ps.

Following the return path, buffer introduces an additional 50 ps, bringing the total delay with respect to the reference clock to 200 ps. Following the return path 414 to the right of buffer 408 back to the region of the reference clock 404 incurs an additional 100 ps, bringing the total delay to 300 ps at a node indicated by reference numeral 415.

Continuing with the example, node 415, having a 300 ps delay, is used as a substitute for the delay_a and delay_c delay elements deployed in the circuit of FIG. 2, thereby obviating a need for the hardware associated with those two delay elements. It may be seen that the 300 ps delay is fed into the lower inputs of the phase detectors 406 and 410 of the circuit leading to local clock net 1 416 and the circuit leading to local clock net 3 412. As discussed in connection with FIG. 2, the output delay at local clock nets 1 and 3 will be 300 ps divided by 2 leading to a value of 150 ps, which is equal to the delay at reference clock net 409. It will be appreciated that numerous permutations and combinations of the circuitry described herein may be constructed in order to provide controlled delays at distributed points throughout an integrated circuit, and all such variations are included within the scope of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of determining transmission delay, said method comprising:
   providing an outbound signal path having an outbound transmission delay;
   providing a return signal path having a return transmission delay, wherein said return delay is associated with said outbound delay;
   determining said outbound delay using said outbound and said return delays.

2. The method of claim 1 further comprising:
   propagating a source signal along said outbound path and said return path; and
   determining a phase change in said signal due to propagation.

3. The method of claim 2 wherein said outbound delay is a known fraction of said phase change.

4. The method of claim 3 wherein said outbound delay and said return delay are equal, and wherein the outbound delay is determined to be one half of said determined phase change.

5. The method of claim 1 wherein said outbound path delivers a clock signal to a portion of an integrated circuit.

6. The method of claim 1 further comprising:
   disposing a variable delay element along each said path.

7. The method of claim 6 further comprising:
   using said variable delay elements to synchronize said outbound delay with other signal delays on an integrated circuit.

8. A method of synchronizing transmission delays, said method comprising:
   providing a signal transmission loop to each of a plurality of destinations, wherein each said loop comprises an outbound portion and a return portion;
   providing a delay element along each said portion of each said loop; and
   using said delay elements to synchronize the transmission delays associated with each said destination.

9. The method of claim 8 wherein said outbound portion and said return portion of each said loop have equal transmission delays.

10. The method of claim 9 further comprising:
    comparing a phase of a signal prior to transmission in each said loop with a phase of said signal after transmission; and
    determining said transmission delay associated with each said destination from said phase comparison.

11. The method of claim 10 further comprising:
    adjusting said transmission delay associated with each destination while maintaining the equality of said outbound and said return delays.

12. The method of claim 8 further comprising:
    providing a reference destination with an associated reference transmission delay, wherein at least one other said transmission delay is adjusted to match said reference transmission delay.

13. The method of claim 12 wherein all said transmission delays are matched to said reference delay.

14. The method of claim 8 wherein each said destination is a location on an integrated chip, and wherein each said loop transmits a clock signal.

15. A system for determining transmission delay, said system comprising:
    a loop propagating a signal to a destination along an outbound portion, and from said destination along a return portion, wherein a signal delay of said return portion is a known factor of a signal delay for said outbound portion; and
    means for determining said outbound delay by comparing said propagated signal to a non-propagated signal.

16. The system of claim 15 further comprising:
    a phase detector comparing a phase of said signal prior to propagation and a phase of said signal after propagation and producing a phase difference.

17. The system of claim 16 wherein said means for determining said outbound delay uses said known factor to convert said phase difference into said outbound delay.

18. The system of claim 17 wherein said outbound delay and said return delay are equal, and wherein said outbound delay is equal to one half of said phase difference.

19. The system of claim 15 further comprising:
    a variable delay element disposed along said outbound portion;
    a variable delay element disposed along said return portion; and
    means for simultaneously adjusting said delay elements.

20. The system of claim 19 wherein said outbound delay is synchronized with other signal delays on an integrated chip.

* * * * *